(12) United States Patent
Koyama et al.

(10) Patent No.: US 8,952,449 B2
(45) Date of Patent: Feb. 10, 2015

(54) SEMICONDUCTOR DEVICE HAVING BOTH IGBT AREA AND DIODE AREA

(75) Inventors: Masaki Koyama, Nukata-gun (JP); Yasushi Ookura, Okazaki (JP); Akitaka Soeno, Toyota (JP); Tatsuji Nagaoka, Aichi-gun (JP); Takahide Sugiyama, Aichi-gun (JP); Sachiko Aoi, Nagoya (JP); Hiroko Iguchi, Aichi-gun (JP)

(73) Assignee: Toyota Jidosha Kabushiki Kaisha, Toyota-Shi (JP)

( * ) Notice: Subject to any disclaimer, the term of this patent is extended or adjusted under 35 U.S.C. 154(b) by 260 days.

(21) Appl. No.: 13/210,624

(22) Filed: Aug. 16, 2011

(65) Prior Publication Data

US 2012/0043582 A1 Feb. 23, 2012

(30) Foreign Application Priority Data

Aug. 17, 2010 (JP) ................. 2010-182357

(51) Int. Cl.
| | |
|---|---|
| H01L 29/06 | (2006.01) |
| H01L 29/861 | (2006.01) |
| H01L 21/263 | (2006.01) |
| H01L 21/266 | (2006.01) |
| H01L 29/08 | (2006.01) |
| H01L 29/32 | (2006.01) |
| H01L 29/739 | (2006.01) |
| H01L 21/265 | (2006.01) |

(52) U.S. Cl.
CPC .......... *H01L 29/8611* (2013.01); *H01L 21/263* (2013.01); *H01L 21/266* (2013.01); *H01L 29/063* (2013.01); *H01L 29/0834* (2013.01); *H01L 29/32* (2013.01); *H01L 29/7397* (2013.01); *H01L 21/26506* (2013.01)
USPC .................................. 257/330; 257/E29.028

(58) Field of Classification Search
None
See application file for complete search history.

(56) References Cited

U.S. PATENT DOCUMENTS

| | | | | |
|---|---|---|---|---|
| 5,808,352 | A * | 9/1998 | Sakamoto ..................... | 257/590 |
| 6,605,830 | B1 * | 8/2003 | Kusunoki ..................... | 257/156 |
| 8,334,193 | B2 * | 12/2012 | Iwasaki et al. ................ | 438/478 |
| 8,748,236 | B2 * | 6/2014 | Tanida .......................... | 438/133 |
| 2005/0258493 | A1 | 11/2005 | Aono et al. | |
| 2008/0079119 | A1 * | 4/2008 | Inoue ............................ | 257/617 |
| 2009/0001411 | A1 * | 1/2009 | Tokura et al. ................. | 257/140 |
| 2009/0032851 | A1 * | 2/2009 | Pfirsch et al. ................ | 257/288 |
| 2009/0242931 | A1 * | 10/2009 | Tsuzuki et al. ............... | 257/143 |
| 2010/0187567 | A1 * | 7/2010 | Tanabe et al. ................ | 257/140 |

FOREIGN PATENT DOCUMENTS

| | | |
|---|---|---|
| DE | 19811568 A | 9/1998 |
| DE | 10 2005 018366 A1 | 11/2005 |
| DE | 10 2006 049212 A1 | 5/2007 |

(Continued)

*Primary Examiner* — Benjamin Sandvik
(74) *Attorney, Agent, or Firm* — Kenyon & Kenyon LLP

(57) ABSTRACT

There is known a semiconductor device in which an IGBT structure is provided in an IGBT area and a diode structure is provided in a diode area, the IGBT area and the diode area are both located within a same substrate, and the IGBT area is adjacent to the diode area. In this type of semiconductor device, a phenomenon that carriers accumulated within the IGBT area flow into the diode area when the IGBT structure is turned off. In order to prevent this phenomenon, a region of shortening lifetime of carriers is provided at least in a sub-area that is within said IGBT area and adjacent to said diode area. In the sub-area, emitter of IGBT structure is omitted.

9 Claims, 15 Drawing Sheets

(56) References Cited

FOREIGN PATENT DOCUMENTS

| | | |
|---|---|---|
| DE | 10 2007 036147 A1 | 3/2009 |
| DE | 10 2009 015726 A1 | 10/2009 |
| JP | 2005-317751 A | 11/2005 |
| JP | 2008-192737 A | 8/2008 |

* cited by examiner

SEMICONDUCTOR DEVICE HAVING BOTH IGBT AREA AND DIODE AREA

CROSS-REFERENCE TO RELATED APPLICATION

This application claims priority to Japanese Patent Application No. 2010-182357 filed on Aug. 17, 2010, the contents of which are hereby incorporated by reference into the present application.

TECHNICAL FIELD

The present invention relates to a semiconductor device in which an IGBT area and a diode area are both located within a same substrate.

DESCRIPTION OF RELATED ART

Japanese Patent Application Laid-Open No. 2005-317751 and Japanese Patent Application Laid-Open No. 2008-192737 disclose semiconductor devices in which an IGBT area and a diode area are both located within a same substrate. Japanese Patent Application Laid-Open No. 2005-317751 describes a structure in which a damage layer is provided entirely over an IGBT area and a diode area. Japanese Patent Application Laid-Open No. 2008-192737 proposes a structure in which a damage layer is provided only at a diode area.

BRIEF SUMMARY OF INVENTION

By providing the damage layer at the diode area, since excess carriers within a substrate recombine in the damage layer and become extinct during recovery of a diode element, recovery characteristics of the diode element are improved. With the structure disclosed in Japanese Patent Application Laid-Open No. 2005-317751 or, in other words, a structure in which a damage layer similar to a damage layer provided at the diode area is also provided at the IGBT area, properties of an IGBT are diminished by the damage layer within the IGBT area. With the structure disclosed in Japanese Patent Application Laid-Open No. 2008-192737 or, in other words, a structure in which a damage layer is only provided at the diode area, properties of an IGBT can be prevented from being diminished by the damage layer.

In a case of a semiconductor device in which an IGBT area and a diode area are both located within a same substrate, a problem arises when an IGBT is turned off in that carriers accumulated within the IGBT area flow into the diode area and, as a result, diode loss increases.

As disclosed in Japanese Patent Application Laid-Open No. 2005-317751, by providing a damage layer entirely over an IGBT area and a diode area, carriers accumulated within the IGBT area can be prevented from flowing into the diode area when turning off an IGBT. A problem of an increase in diode loss does not occur. However, as described earlier, the property of the IGBT becomes diminished. As disclosed in Japanese Patent Application Laid-Open No. 2008-192737, when a damage layer is provided only at a diode area, the property of an IGBT remains undiminished. However, carriers accumulated within the IGBT area cannot be kept from flowing into the diode area when the IGBT is turned off. As a result, diode loss increases.

An object of the present invention is to provide a semiconductor device in which the property of an IGBT is not diminished and diode loss does not increase.

In a case of a semiconductor device in which an IGBT area and a diode area are both located within a same substrate, there is an area where a collector layer constituting an IGBT structure is formed but an emitter region and/or a gate electrode constituting an IGBT structure is not formed. This area is located within the IGBT area at a side adjacent to the diode area. In other words, the IGBT area includes an area in which a complete IGBT structure is formed, and an area having an incomplete IGBT structure due to a presence of a collector layer and an absence of an emitter region and/or a gate electrode. In the present specification, the former will be referred to as a complete sub-area and the latter as an incomplete sub-area. The IGBT area includes a complete sub-area and an incomplete sub-area. The complete sub-area, the incomplete sub-area, and the diode area are arranged in this order.

In the present invention, the incomplete sub-area is used to suppress carriers accumulated within the IGBT area from flowing into the diode area when the IGBT is turned off and to prevent diode loss from increasing.

By introducing lattice defects into the incomplete sub-area, the lattice defects become recombination centers of carriers and suppress carriers accumulated within the IGBT area from flowing into the diode area. Even at the IGBT area, as long as lattice defects are introduced into the incomplete sub-area within the IGBT area, the property of the IGBT can be prevented from being diminished. By introducing lattice defects into the incomplete sub-area, a semiconductor device can be obtained in which the property of the IGBT is not diminished and diode loss is not increased. Introducing lattice defects is equivalent to introducing carrier recombination centers and to forming a region of shortening lifetime of carriers.

Lattice defects need not be introduced into the complete sub-area. In this case, lattice defects are only introduced into the incomplete sub-area. A small amount of lattice defects may be introduced into the complete sub-area. Introducing only a small amount of lattice defects into the complete sub-area may improve, rather than diminish, the property of the IGBT. When a small number of lattice defects are introduced into the complete sub-area, a greater number of lattice defects are introduced into the incomplete sub-area. A density of lattice defects as used in the present specification refers to a density averaged over a thickness of the substrate. The density of lattice defects increases when a large amount of lattice defects is introduced at a specific depth. A description of a density of lattice defects introduced into the incomplete sub-area being greater than a density of lattice defects introduced into the complete sub-area includes both a case where lattice defects are not introduced into the complete sub-area and a case where a small amount of lattice defects is introduced into the complete sub-area.

The density of lattice defects introduced into a diode area is not restricted. The density of lattice defects introduced into the diode area may either be higher or lower than the density of lattice defects introduced into the incomplete sub-area. The lattice defects introduced into the diode area do not directly affect the property of the IGBT and do not directly affect a phenomenon of suppressing carriers accumulated within the IGBT area from flowing into the diode area.

Various techniques may be utilized in order to secure a relationship in which the density of lattice defects introduced into the incomplete sub-area is higher than the density of lattice defects introduced into the complete sub-area. The present invention is not restricted by such techniques.

DETAILED DESCRIPTION OF INVENTION

Figure 1:
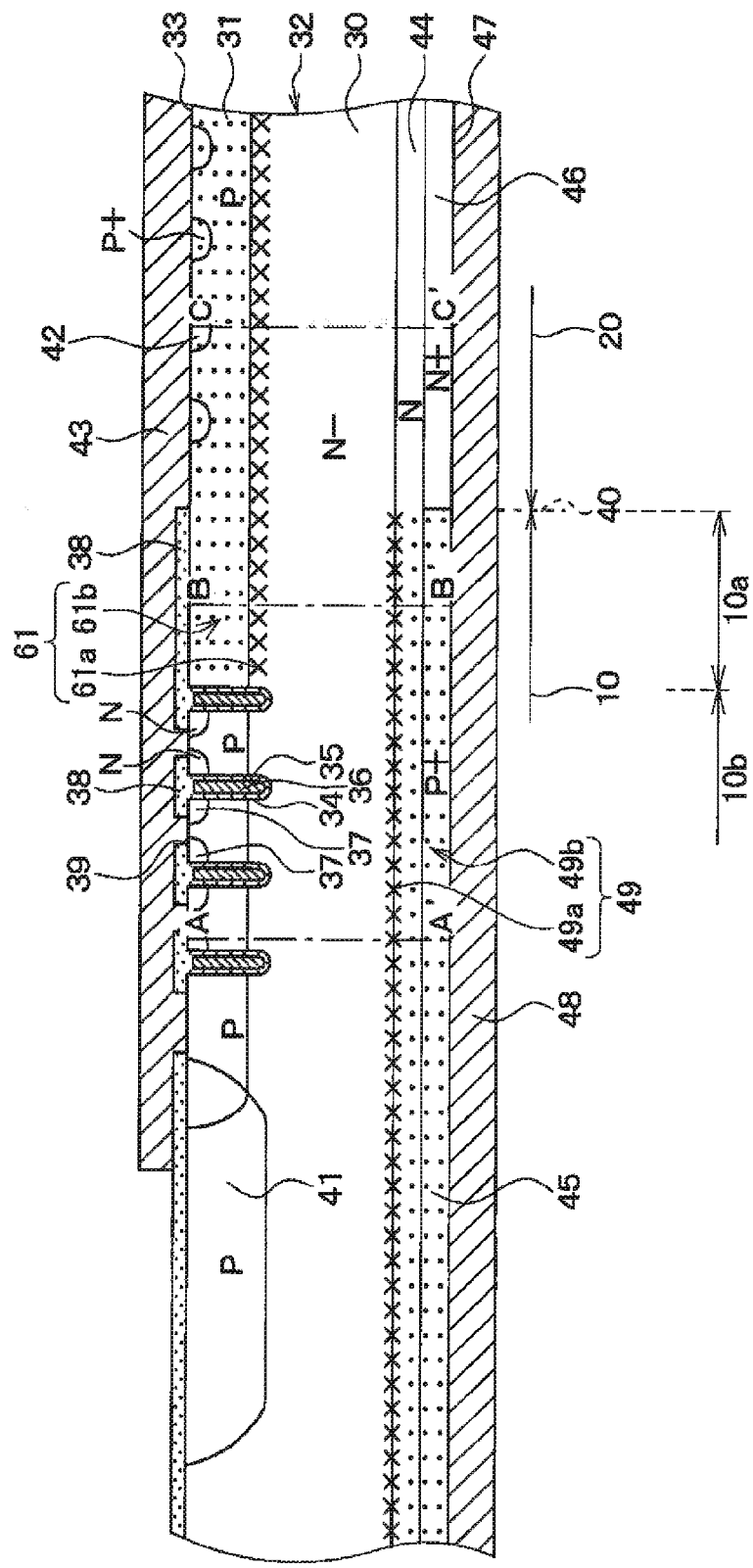
FIG. 1 is a cross-sectional view of a semiconductor device according to a first embodiment.

Representative, non-limiting examples of the present invention will now be described in further detail with reference to the attached drawings. This detailed description is merely intended to teach a person skilled in the art further details for practicing preferred aspects of the present teachings and is not intended to limit the scope of the invention. Furthermore, each of the additional features and teachings disclosed below may be utilized separately or in conjunction with other features and teachings to provide improved semiconductor devices.

Moreover, combinations of features and steps disclosed in the following detailed description may not be necessary to practice the invention in the broadest sense, and are instead taught merely to particularly describe representative examples of the invention. Furthermore, various features of the above-described and below-described representative examples, as well as the various independent and dependent claims, may be combined in ways that are not specifically and explicitly enumerated in order to provide additional useful embodiments of the present teachings.

All features disclosed in the description and/or the claims are intended to be disclosed separately and independently from each other for the purpose of original written disclosure, as well as for the purpose of restricting the claimed subject matter, independent of the compositions of the features in the embodiments and/or the claims. In addition, all value ranges or indications of groups of entities are intended to disclose every possible intermediate value or intermediate entity for the purpose of original written disclosure, as well as for the purpose of restricting the claimed subject matter.

According to one type of the present invention, a surface electrode that doubles as an emitter electrode of an IGBT structure and an anode electrode of a diode structure is formed on a surface of a semiconductor substrate, and a rear surface electrode that doubles as a collector electrode of the IGBT structure and a cathode electrode of the diode structure is formed on a rear surface of the semiconductor substrate. When the semiconductor substrate is observed from a direction perpendicular thereto, an IGBT area and a diode area are arranged adjacent to each other. At a portion within the IGBT area and adjacent to the diode area, an emitter is not formed and an IGBT structure is not completed. A complete sub-area in which an IGBT structure is completed is provided with an emitter, a base, a gate electrode, a drift, a field stop, and a collector. In an incomplete sub-area, at least one of an emitter and a gate electrode is not provided. In some cases, both an emitter and a gate electrode are not formed in an incomplete sub-area. A diode area is provided with an anode, a drift, and a cathode. The collector of the IGBT and the cathode of the diode are adjacent to and in contact with each other. A boundary between the collector and the cathode is a boundary between the IGBT area and the diode area.

When the semiconductor substrate is exposed to an energy beam such as an ion beam or an electron beam, lattice defects are introduced into the semiconductor substrate. The lattice defects become recombination centers of carriers and shorten lifetime of carriers. An area into which lattice defects or recombination centers of carriers are introduced becomes a region of shortening lifetime of carriers.

A surface of the semiconductor substrate on which the surface electrode is formed and a rear surface of the semiconductor substrate on which the rear surface electrode is formed may be exposed to an energy beam. Favorably, a surface of the incomplete sub-area is exposed to an energy beam and a surface of the complete sub-area is not exposed to an energy beam. While a rear surface of the incomplete sub-area must be exposed to an energy beam, a rear surface of the complete sub-area need not be exposed to an energy beam. The rear surface of the complete sub-area may or may not be exposed to an energy beam.

Only the rear surface of the semiconductor substrate may be exposed to an energy beam. In this case, a rear surface of the incomplete sub-area may be exposed to an energy beam and a rear surface of the complete sub-area may not be exposed to an energy beam. The rear surface of the incomplete sub-area and the rear surface of the complete sub-area may both be exposed to an energy beam. In this case, the rear surface of the incomplete sub-area is exposed at high intensity while the rear surface of the complete sub-area is exposed at low intensity.

The intensity of the energy beam to which the incomplete sub-area is exposed may either be uniform or varied according to location. In the latter case, a region close to the complete sub-area is exposed at low intensity and a region close to the diode area is exposed at high intensity. In a location where exposure intensity to the energy beam is high, an area with a long penetrating distance from the rear surface becomes a region of shortening lifetime, and in a location where exposure intensity to the energy beam is low, an area with a short penetrating distance from the rear surface becomes a region of shortening lifetime.

A mask having a specific pattern may be used in order to regulate an energy beam exposure area. A mask whose thickness varies from location to location may be used to vary energy beam exposure intensity from location to location.

Hereinafter, embodiments of the present invention will be described with reference to the drawings. In the respective embodiments below, parts similar or equivalent to each other are denoted in the drawings using similar reference characters.

First Embodiment

A first embodiment of the present invention will be described with reference to the drawings. A semiconductor device described in the present embodiment is used as, for example, a power switching element for a power supply circuit such as an inverter or a DC/DC converter.

FIG. 1 is a cross-sectional view of a semiconductor device according to the present embodiment. As shown in the drawing, the semiconductor device includes an IGBT area 10 and a diode area 20. The IGBT area 10 and the diode area 20 are formed on a same semiconductor substrate 32. The IGBT area 10 is formed in an area adjacent to the diode area 20.

An N⁻ silicon wafer is used as the unprocessed semiconductor substrate 32. As shown in FIG. 1, at the IGBT area 10 and the diode area 20, P-type impurities are implanted from a surface 33 of the semiconductor substrate 32 and subjected to heat treatment to form a P-type base layer 31. At the IGBT area 10 and the diode area 20, N-type impurities are implanted from a rear surface 47 of the semiconductor substrate 32 and subjected to heat treatment to form an N-type field stop layer 44. At the IGBT area 10, P-type impurities are implanted from the rear surface 47 of the semiconductor substrate 32 and subjected to heat treatment to form a P⁺ collector layer 45. At the diode area 20, N-type impurities are implanted from the rear surface 47 of the semiconductor substrate 32 and subjected to heat treatment to form an N⁺ cathode layer 46. The collector layer 45 and the cathode layer 46 are formed on a same level and a boundary between the collector layer 45 and the cathode layer 46 is a boundary 40 between the IGBT area 10 and the diode area 20. Among the N⁻ semiconductor substrate 32, an area between the base layer 31 and the field stop layer 44 is retained as an unprocessed silicon wafer and functions as an N⁻ drift layer 30.

The IGBT area 10 is provided with a plurality of trenches 34 which penetrates the base layer 31 from the surface 33 of the base layer 31 and reaches the drift layer 30. Each trench 34 extends along the surface 33 of the semiconductor substrate 32 in a direction perpendicular to a plane of paper. The plurality of trenches 34 is arranged parallel to each other at regular intervals.

A gate insulator film 35 is formed on an inner wall of each trench 34. A gate electrode 36 made of polysilicon or the like is embedded inside the gate insulator film 35. Consequently, a trench-gate structure is constructed. Moreover, the gate electrode 36 is connected via extraction wiring (not shown) to a gate upper electrode (not shown) provided at a partial area on the surface 33 of the semiconductor substrate 32.

For example, the trench 34 is formed by a photolithographic etching process, and the gate insulator film 35 is formed by thermal oxidation, a CVD method, or the like. In addition, the gate electrode 36 is embedded into the trench 34 by a CVD method or the like.

An N⁺ emitter region 37 is formed on a surface layer part of the base layer 31. The emitter region 37 is formed on both sides of each trench 34. An area which exists between the N⁺ emitter region 37 and the N⁻ drift layer 30 and which opposes the gate electrode 36 via the gate insulator film 35 constitutes a channel region. When a positive potential is applied to the gate electrode 36, the channel region is inverted to an N-type and conduction is achieved between the N⁺ emitter region 37 and the N⁻ drift layer 30. When the application of the positive potential to the gate electrode 36 is stopped, the channel region is restored to a P-type and insulation is achieved between the N⁺ emitter region 37 and the N⁻ drift layer 30. The semiconductor device that functions as an IGBT is completed by the emitter region 37, the base layer 31, the gate insulator film 35, the gate electrode 36, the drift layer 30, the field stop layer 44, and the collector layer 45.

Among the IGBT area 10, the emitter region 37 and the gate electrode 36 are not formed in an area 10a that is adjacent to the diode area 20. Since the collector layer 45 instead of the cathode layer 46 is formed in the area 10a, the area 10a is the IGBT area 10. However, since the emitter region 37 and the gate electrode 36 are not formed, a complete IGBT structure is not formed. In the present specification, an area in which a complete IGBT structure is formed is referred to as a complete sub-area 10b, an area in which the collector layer 45 is formed but the emitter region 37 and the gate electrode 36 are not formed is referred to as an incomplete sub-area 10a, and an area in which the cathode layer 46 is formed is referred to as a diode area. The complete sub-area 10b, the incomplete sub-area 10a, and the diode area 20 are arranged in this order. The incomplete sub-area 10a is formed within the IGBT area 10 in an area adjacent to the diode area 20.

A plurality of P⁺ contact regions 42 is formed on a surface layer part of the base layer 31 at the diode area 20. In addition, a P-type resurf region 41 is formed on a surface layer part of the drift layer 30 on an outer peripheral side of the IGBT area 10. The resurf region 41 is deeper than the base layer 31 and functions as an outer peripheral breakdown voltage increasing region.

An interlayer dielectric film 38 made of PSG or the like is formed on top of the base layer 31. The interlayer dielectric film 38 covers an upper surface of the gate electrode 36. The interlayer dielectric film 38 does not cover between the gate electrode 36 and an adjacent gate electrode 36. An area which exists between the gate electrodes 36 and which is not covered by the interlayer dielectric film 38 constitutes a contact hole 39. Upper surfaces of the emitter region 37 and the base layer 31 are exposed at the contact hole 39. The interlayer dielectric film 38 is covered by an emitter electrode 43. At the IGBT area 10, the emitter electrode 43 is in conduction with the emitter regions 37 and the base layer 31 at the contact holes 39. At the diode area 20, the emitter electrode 43 is in conduction with the contact regions 42 and the base layer 31. The emitter electrode 43 is an emitter electrode of the IGBT area 10 and an anode electrode of the diode area 20. The interlayer dielectric film 38 covers a surface of the base layer 31 of the incomplete sub-area 10a among the IGBT area 10.

A collector electrode 48 is formed on the rear surface 47 of the semiconductor substrate 32. The collector electrode 48 is formed on the rear surface 47 of the semiconductor substrate 32 by sputtering Al or the like. The collector electrode 48 is in conduction with the collector layer 45 at the IGBT area 10 and with the cathode layer 46 at the diode area 20. The collector electrode 48 is a collector electrode in an IGBT structure and a cathode electrode in a diode structure.

In the structures described above, regions 49 and 61 which shorten lifetime of carriers are formed on the semiconductor substrate 32.

The region 61 is a region exposed to an ion beam from the surface 33 (a surface on the side where the emitter electrode 43 is formed) of the semiconductor substrate 32. Ions penetrate to and are retained at a predetermined distance from the surface 33 of the semiconductor substrate 32. A group of dots 61b in the drawing denotes an area in which lattice defects have been formed by passage of ions, while x-marks 61a denote an area in which lattice defects have been formed by retention of ions. Lattice defects formed by the retention of ions are formed at a depth in a vicinity of a bottom surface of the base layer 31. The lattice defects function as recombination centers of carriers and shorten the lifetime of carriers. The region 61 is formed only at the incomplete sub-area 10a among the IGBT area 10 and at the diode area 20. The region 61 is not formed at the complete sub-area 10b among the IGBT area 10.

The region 49 is a region exposed to an ion beam from the rear surface 47 (a surface on the side where the collector electrode 48 is formed) of the semiconductor substrate 32. Ions penetrate to and are retained at a predetermined distance from the rear surface 47 of the semiconductor substrate 32. A group of dots 49b in the drawing denotes an area in which lattice defects have been formed by passage of ions, while x-marks 49a denote an area in which lattice defects have been formed by retention of ions. Lattice defects formed by the retention of ions are formed at a depth in a vicinity of a top surface of the field stop layer 44. The lattice defects function as recombination centers of carriers and shorten the lifetime of carriers. The region 49 is only formed at the IGBT area 10. The region 49 is not formed at the diode area 20.

Both regions 49 and 61 which shorten the lifetime of carriers are formed at the incomplete sub-area 10a among the IGBT area 10. The shortening regions 49 and 61 overlap each other at the incomplete sub-area 10a. The region 61 which shortens lifetime of carriers is not formed at the complete sub-area 10b. The region 49 which shortens lifetime of carriers is not formed at the diode area 20. A density of lattice defects introduced into the incomplete sub-area 10a is higher than a density of lattice defects introduced into the complete sub-area 10b. A density of lattice defects as used herein refers to a lattice defect density averaged over an entire thickness of the semiconductor substrate 32.

Lattice defects become centers where a hole and an electron are recombined and become extinct and thereby shortens lifetime of carriers. Due to the lattice defects introduced into the incomplete sub-area 10a, holes become extinct during a movement of the holes from the complete sub-area 10b of the IGBT area 10 to the diode area 20 through the incomplete sub-area 10a. The lattice defects introduced into the incomplete sub-area 10a suppress the carriers from flowing into the diode area 20 from the IGBT area 10.

Figure 2A:
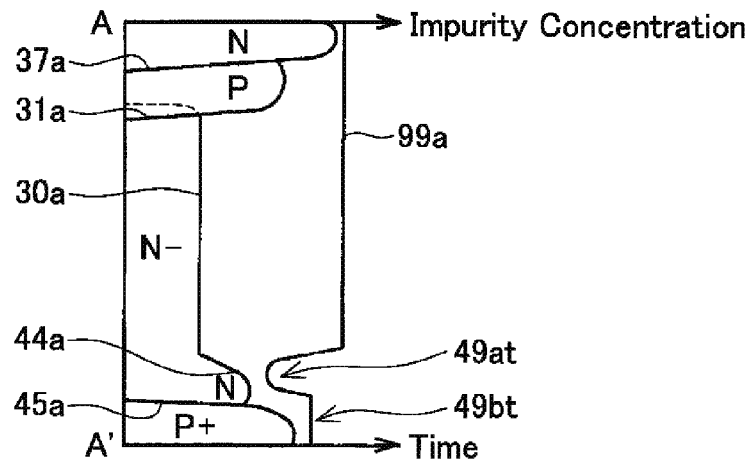
FIGS. 2a, 2b, and 2c are diagrams showing impurity profiles and lifetimes of the respective part shown in FIG. 1.
Figure 2B:
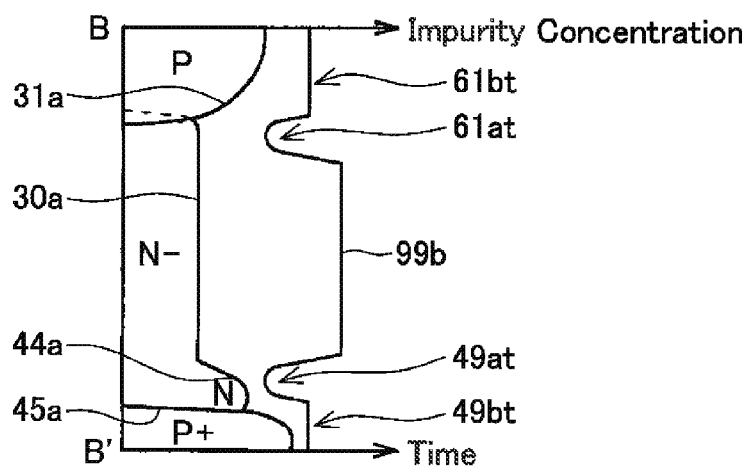
Figure 2C:
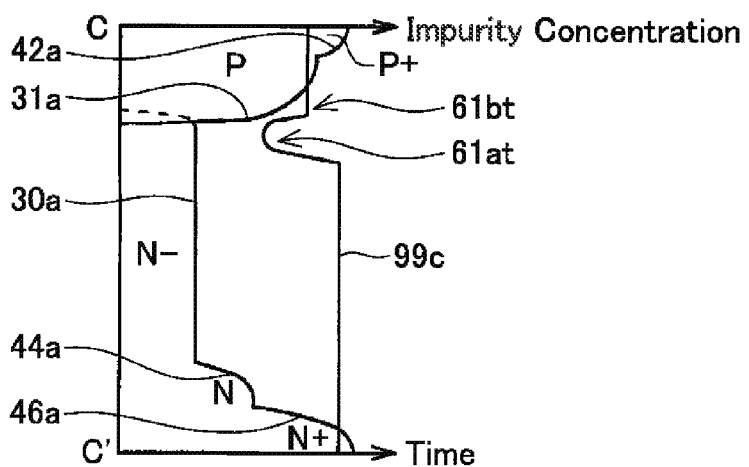

Ordinates in FIGS. 2a to 2c indicate depths within the semiconductor substrate 32 and abscissas indicate impurity concentrations. A numeral with a suffix "a" indicates an impurity concentration profile of a corresponding layer. For example, a curve 37a indicates an impurity concentration profile of the emitter region 37. The abscissas also indicate lifetimes of impurities. The curves 99a, 99b, and 99c indicate a relationship between depth and lifetime. FIG. 2a shows a relationship between depth and impurity concentration and between depth and lifetime at an A-A' portion (within complete sub-area 10b) of FIG. 1. FIG. 2b shows similar relationships for a B-B' portion (within incomplete sub-area 10a) in FIG. 1. FIG. 2c shows similar relationships for a C-C' portion (within diode area 20) in FIG. 1.

As shown in FIG. 2b, at the incomplete sub-area 10a, the lifetime of carriers is shorter in an ion retention region 61a (refer to a curve 61at). The lifetime of carriers is also shorter in an ion passage region 61b (refer to a straight line 61bt). In addition, the lifetime of carriers is also shorter in an ion retention region 49a (refer to a curve 49 at). The lifetime of carriers is also shorter in an ion passage region 49b (refer to a straight line 49bt). No lattice defects have been introduced into a region between the ion retention region 61a and the ion retention region 49a and the lifetime of carriers is longer.

As shown in FIG. 2a, the complete sub-area 10b does not have the ion retention region 61a and the ion passage region 61b and, as a result, shortening of the lifetime of carriers does not occur (the curve 61at and the straight line 61bt do not exist).

As shown in FIG. 2c, the diode area 20 does not have the ion retention region 49a and the ion passage region 49b and, as a result, shortening of the lifetime of carriers does not occur (the curve 49 at and the straight line 49bt do not exist).

Regions 49a, 49b, 61a, and 61b that are formed at the incomplete sub-area 10a are, at the same time, lattice defect-introduced regions, recombination center-introduced regions, and lifetime shortening regions. When lifetime shortening regions 49a, 49b, 61a, and 61b are formed at the incomplete sub-area 10a between the complete sub-area 101) and the diode area 20, implanting of holes from the IGBT area 10 to the diode area 20 can be suppressed. Therefore, during operation of a diode element, gate interference that causes a forward voltage Vf of the diode element to vary depending on a gate signal inputted to the gate electrode 36 of an IGBT element can be prevented. In addition, since the lifetime shortening regions 49a, 49b, 61a, and 61b cause carriers that contribute to reverse currents during recovery to become extinct due to recombination, recovery failure can be prevented.

Furthermore, due to the lifetime shortening regions 49a and 49b formed at the complete sub-area 10b, excess carriers that are accumulated in the drift layer 30 within the complete sub-area 10b become extinct due to recombination. As a result, in the IGBT element, favorable tradeoff characteristics between switching loss and steady loss can be obtained. Since the lifetime shortening regions 61a and 61b do not exist at the complete sub-area 10b, a shortage of carriers accumulated in the drift layer 30 never occurs. An on-resistance of the IGBT element can be sufficiently lowered. In addition, when excess carriers exist in the drift layer 30 of the diode area 20, since the excess carriers become extinct due to recombination by the lifetime shortening regions 61a and 61b formed at the diode area 20, favorable tradeoff characteristics between switching loss and steady loss can also be obtained in the diode element.

When comparing FIGS. 2a and 2b, it is evident that the number of lattice defects introduced into the incomplete sub-area 10a is greater than the number of lattice defects introduced into the complete sub-area 10b. The number of lattice defects added up over the entire thickness of the semiconductor substrate 32 is large at the incomplete sub-area 10a and small at the complete sub-area 10b. The thickness of the semiconductor substrate 32 is the same at the incomplete sub-area 10a and the complete sub-area 10b. In other words, a lattice defect density (a density averaged over the thickness of the semiconductor substrate 32) at the incomplete sub-area 10a is higher than a lattice defect density at the complete sub-area 10b, if this relationship exists, when the IGBT becomes conductive, an active conductivity modulation phenomenon is produced in the drift layer 30 of the complete sub-area 10b and on-voltage decreases. Lifetime is shortened at the incomplete sub-area 10a. Therefore, when the IGBT is turned off, holes accumulated at the complete sub-area 10b become extinct during movement of the holes through the incomplete sub-area 10a to the diode area 20. As a result, gate interference that occurs during diode operation due to the holes being implanted into the diode area 20 from the IGBT area 10 can be prevented.

A formation process of the lifetime shortening regions 49a, 49b, 61a, and 61b will be described with reference to FIG. 3. First, the base layer 31, the emitter region 37, and the contact region 42 are formed on a surface layer portion of the drift layer 30. Next, a trench-gate structure is formed. Processing is performed with the substrate 32 in a wafer state.

Subsequently, before forming the emitter electrode 43, a part of the surface 33 of the semiconductor substrate 32 is covered by a He ion mask 50 and the surface 33 of the semiconductor substrate 32 is exposed to He ions. The He ion mask 50 is made from Al, Si, lead, or the like. The He ion mask 50 is adjusted to a position and a shape which enable the complete sub-area 10b to be covered and the incomplete sub-area 10a and the diode area 20 to be exposed. As a result, the lifetime shortening regions 61a and 61b are formed at the incomplete sub-area 10a and the diode area 20.

Next, a surface on a side opposite to the base layer 31 of the drift layer 30 is polished and thinned down to a desired thickness, and phosphorus or the like is ion-implanted (at 600 keV, $2 \times 10^{12}/cm^2$) on the entire thinned surface to form the field stop layer 44. In addition, phosphorus is ion-implanted (at 50 keV, $5 \times 10^{14}/cm^2$) on the diode area 20 to form the cathode layer 46.

Subsequently, the diode area 20 is covered by a He ion mask 51 and exposed to He ions. The He ion mask 51 is made from Al, Si, lead, or the like. As a result, the lifetime shortening regions 49a and 49b are formed at the complete sub-area 10b and the incomplete sub-area 10a. Furthermore, the same He ion mask 51 is used to perform ion implantation of boron. For example, boron ion implantation is performed at 100 keV, $2 \times 10^{15}/cm^2$ to form the collector layer 45. The He ion mask 51 is used in both the formation process of the lifetime shortening regions 49a and 49b and the formation process of the collector layer 45.

Subsequently, annealing for stabilizing lattice defects and annealing for activating a rear-surface impurity layer are performed and the collector electrode 48 is formed. The wafer is then diced to produce a semiconductor device. As described above, by exposing the semiconductor substrate 32 to He ions using the He ion masks 50 and 51, the lifetime shortening regions 49a, 49b, 61a, and 61b can be formed on the semiconductor substrate 32. In the present embodiment, lattice defects are introduced by exposing the semiconductor substrate 32 to He ions. The lattice defects may be introduced by exposure to other ions or electron beams. By exposing the semiconductor substrate 32 to an energy beam, lattice defects can be generated and regions that shorten the lifetime of carriers can be formed.

Figure 3:
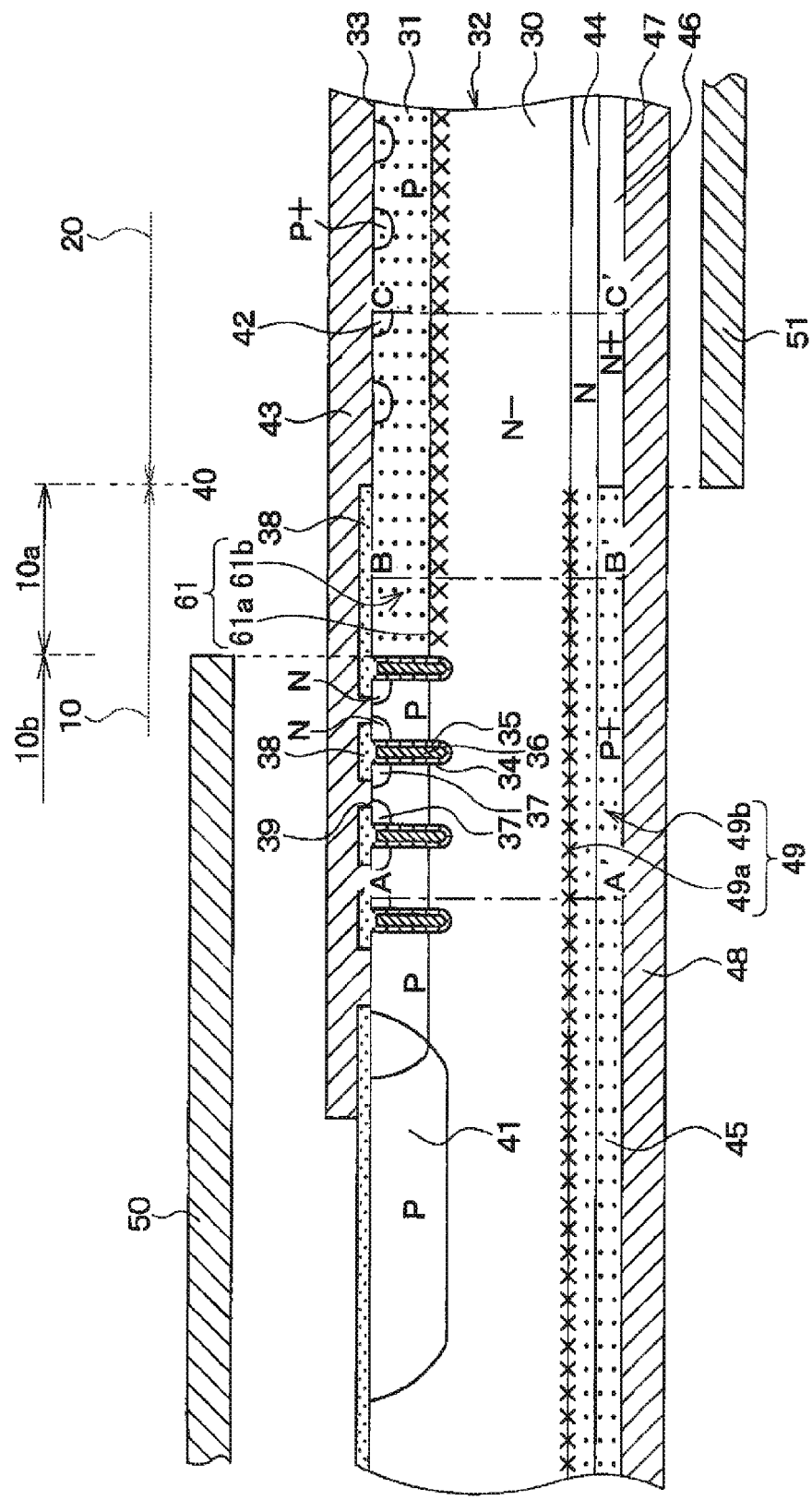
FIG. 3 is a diagram showing a formation process of a lifetime shortening region.

The dots depicted in FIGS. 1 and 3 denote a part of lifetime shortening regions into which lattice defects have been introduced by the passage of He ions, and the x-marks denote parts in which the exposed He ions are retained and lifetimes are most shortened.

Second Embodiment

Figure 4:
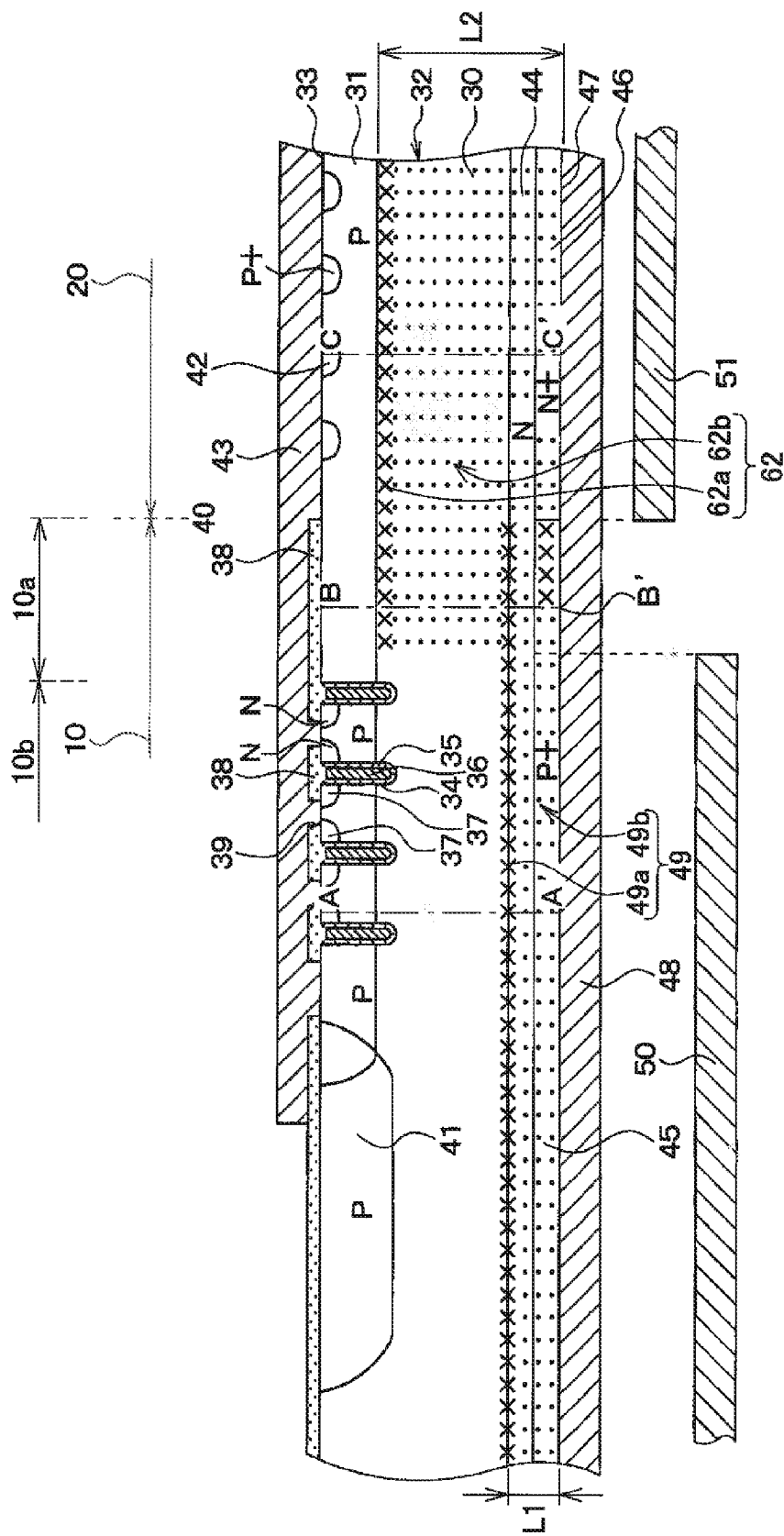
FIG. 4 is a cross-sectional view of a semiconductor device according to a second embodiment.

In the present embodiment, portions that differ from the first embodiment will be described. FIG. 4 is a cross-sectional view of a semiconductor device according to the present embodiment. The cross-sectional view in FIG. 4 also shows an He ion mask 51 for forming a lifetime shortening region 49 and a He ion mask 50 for forming a lifetime shortening region 62.

As shown in FIG. 4, in the present embodiment, the lifetime shortening region 49 is formed by exposing an IGBT area 10 (both a complete sub-area 10b and an incomplete sub-area 10a) among a rear surface 47 of the semiconductor substrate 32 to He ions using the mask 51. In addition, the lifetime shortening region 62 is formed by exposing the incomplete sub-area 10a and a diode area 20 among the rear surface 47 of the semiconductor substrate 32 to He ions using the mask 50.

When exposing the IGBT area 10 to He ions using the mask 51, He ions are implanted with an energy that causes the He ions to penetrate into the semiconductor substrate 32 by precisely a distance of L1. A depth at which the He ions are retained is approximately equal to an upper surface of a field stop layer 44. In the IGBT area 10, a large number of lattice defects are introduced into a vicinity of the upper surface of the field stop layer 44. When exposing the incomplete sub-area 10a and the diode area 20 to He ions using the mask 50, He ions are implanted with an energy that causes the He ions to penetrate into the semiconductor substrate 32 by precisely a distance of L2. A depth at which the He ions are retained is approximately equal to an upper surface of the drift layer 30. In the incomplete sub-area 10a and the diode area 20, a large number of lattice defects are introduced into a vicinity of the upper surface of the drift layer 30. In the incomplete sub-area 10a, both the lifetime shortening regions 49a and 49b and the lifetime shortening regions 62a and 62b are formed.

In a manufacturing process, upper structures of an IGBT element and a diode element are formed on a side of a surface 33 of the semiconductor substrate 32. Next, the side of the rear surface 47 of the semiconductor substrate 32 is polished and thinned down to a predetermined thickness. Subsequently, ion implantation is performed to form the field stop layer 44. In addition, ion implantation is performed at the diode area 20 to form a cathode layer 46.

Subsequently, the rear surface 47 of the semiconductor substrate 32 at the diode area 20 is covered by the He ion mask 51 and the IGBT area 10 is exposed to He ions. As a result, the lifetime shortening regions 49a and 49b are formed at the IGBT area 10. In addition, ion implantation is performed using the same He ion mask 51 to form a collector layer 45. A formation area of the collector layer 45 is equal to a formation area of the lifetime shortening regions 49a and 49b. The lifetime shortening regions 49a and 49b are formed over an entire thickness of the collector layer 45 and the field stop layer 44.

Subsequently, the rear surface 47 of the semiconductor substrate 32 within the complete sub-area 10b is covered by the He ion mask 50 and the diode area 20 and the incomplete sub-area 10a are exposed to He ions. As a result, the lifetime shortening regions 62a and 62b are formed at the diode area 20 and the incomplete sub-area 10a. The lifetime shortening regions 62a and 62b are formed over an entire thickness of the cathode layer 46, the field stop layer 44, and the drift layer 30.

Figure 5A:
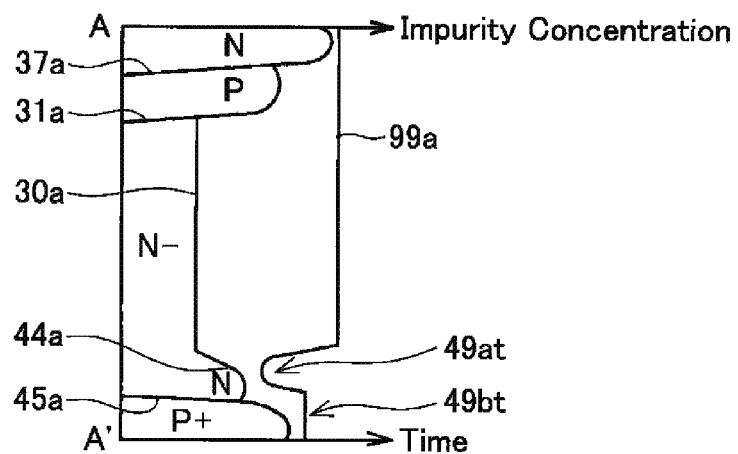
FIGS. 5a, 5b, and 5c are diagrams showing impurity profiles and lifetimes of the respective part shown in FIG. 4.
Figure 5B:
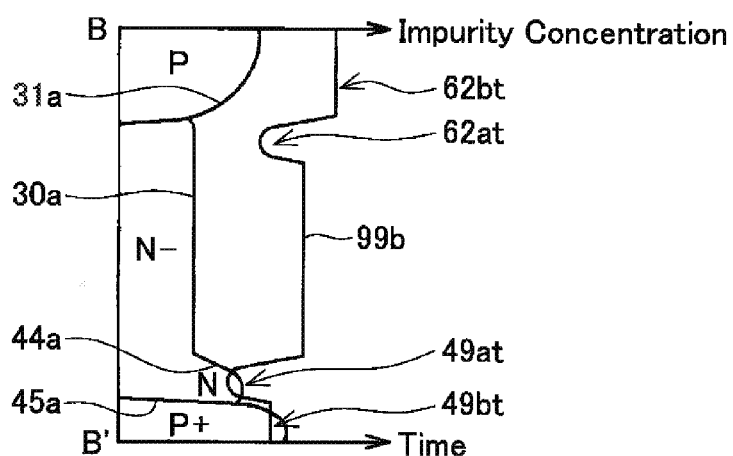
Figure 5C:
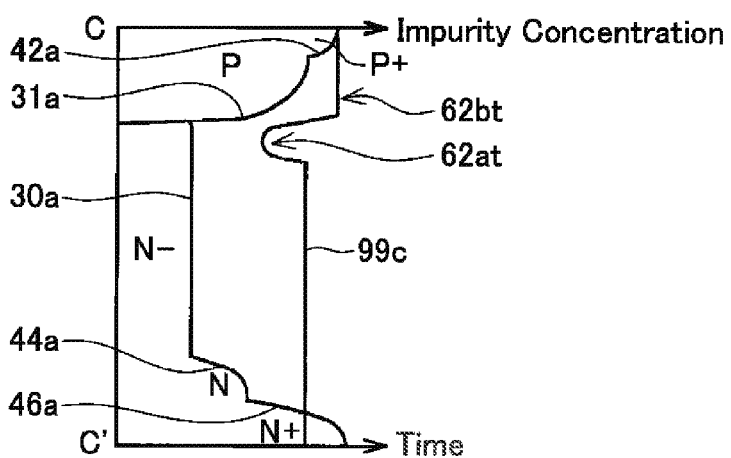

Once the lifetime shortening regions 49a, 49b, 62a, and 62b are formed, the lifetime of carriers is shortened as shown in FIGS. 5a to 5c. As shown in FIGS. 5a and 5b, at the IGBT area 10 (both the complete sub-area 10b and the incomplete sub-area 10a), lifetime is significantly shortened at a depth in a vicinity of the field stop layer 44. Lifetime is also shortened in the formation area of the collector layer 45.

As shown in FIGS. 5b and 5c, at the incomplete sub-area 10a and the diode area 20, lifetime levels are shortened overall across the drift layer 30 to the cathode layer 46. Lifetime is significantly shortened at a depth in a vicinity of an upper surface of the drift layer 30.

As shown in FIG. 5a, lifetime in the drift layer 30 is not shortened at the complete sub-area 10b. Therefore, when an IGBT becomes conductive, an active conductivity modulation phenomenon is produced in the drift layer 30 and on-voltage decreases. Lifetime of the drift layer 30 is shortened at the incomplete sub-area 10a. Therefore, when the IGBT is turned off, holes accumulated at the complete sub-area 10b become extinct during movement of the holes to the diode area 20. As a result, gate interference that occurs during diode operation due to the holes being implanted into the diode area 20 from the IGBT area 10 can be prevented. Furthermore, breakage of elements at the incomplete sub-area 10a during reverse recovery can be prevented.

Third Embodiment

Figure 6:
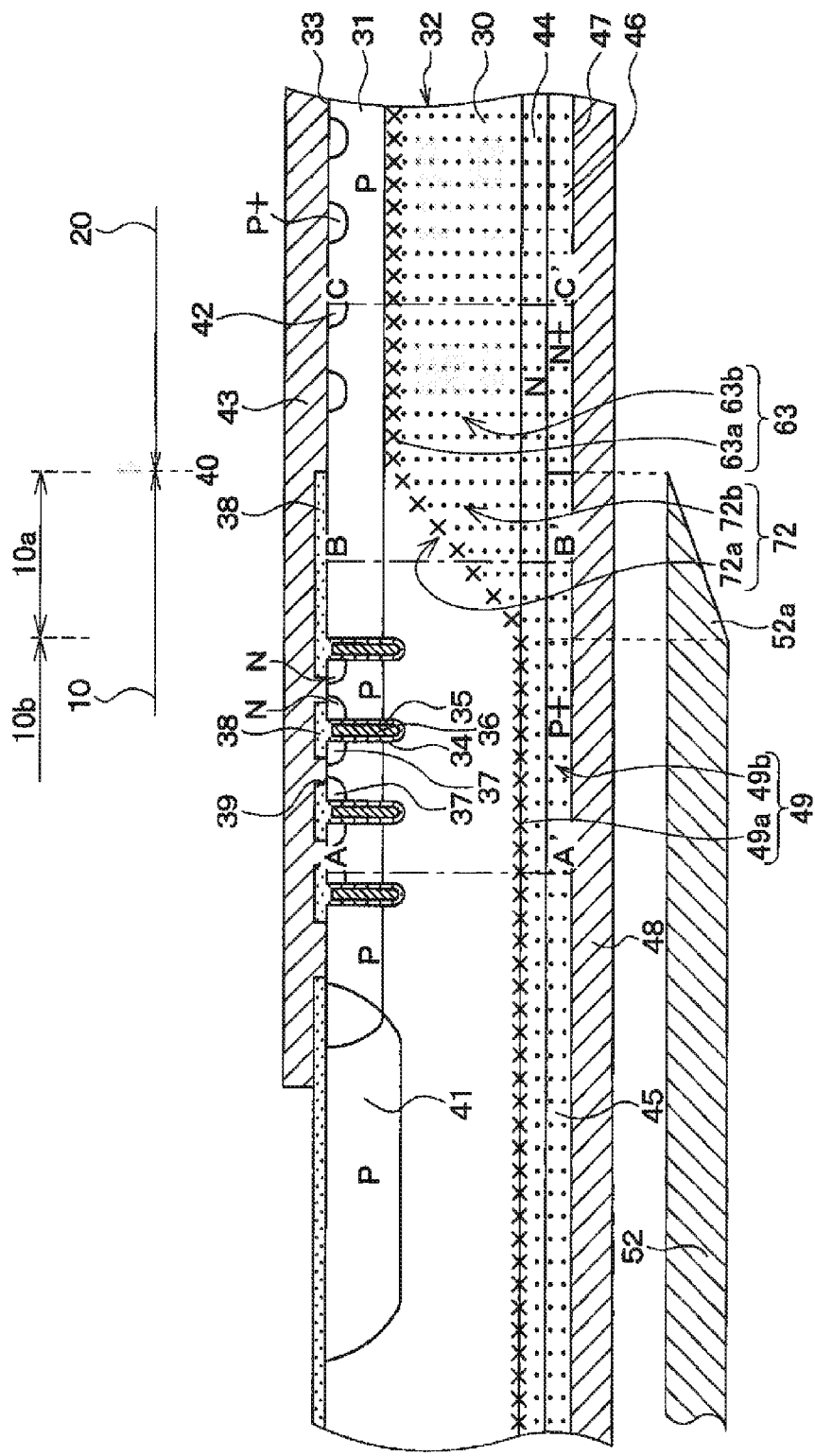
FIG. 6 is a cross-sectional view of a semiconductor device according to a third embodiment.

In the present embodiment, portions that differ from the first embodiment will be described. FIG. 6 is a cross-sectional view of a semiconductor device according to the present embodiment which also shows a mask 52 for forming lifetime shortening regions 49, 63, and 72.

As shown in FIG. 6, a rear surface of a He ion mask 52 according to the present embodiment is inclined at a certain angle at an incomplete sub-area 10a. In other words, the mask 52 is thick at a complete sub-area 10b and becomes thinner toward a diode area 20 at the incomplete sub-area 10a.

When a semiconductor substrate 32 is exposed to He ions by arranging the He ion mask 52 on the side of a rear surface 47 of the semiconductor substrate 32, a penetration distance of the He ions is short at a thick portion of the mask 52. The penetration distance of the He ions becomes longer as the mask 52 becomes thinner, and penetration is deepest at an area not covered by the mask 52.

In FIG. 6, a lifetime shortening region 49 is a region formed by exposure to He ions through a thick mask 52 and, therefore, has a short penetrating distance from the rear surface 47. A lifetime shortening region 63 is a region formed by exposing an area not covered by the mask 52 to He ions and, therefore, has a long penetrating distance from the rear surface 47. A lifetime shortening region 72 is a region formed by exposure to He ions through a mask 52 with varying thickness and, therefore, has a penetrating distance from the rear surface 47 that becomes longer the closer to the diode area 20. At the incomplete sub-area 10a, the penetrating distance of the lifetime shortening region 72 varies from the short penetrating distance of the lifetime shortening region 49 to the long penetrating distance of the lifetime shortening region 63.

Figure 7A:
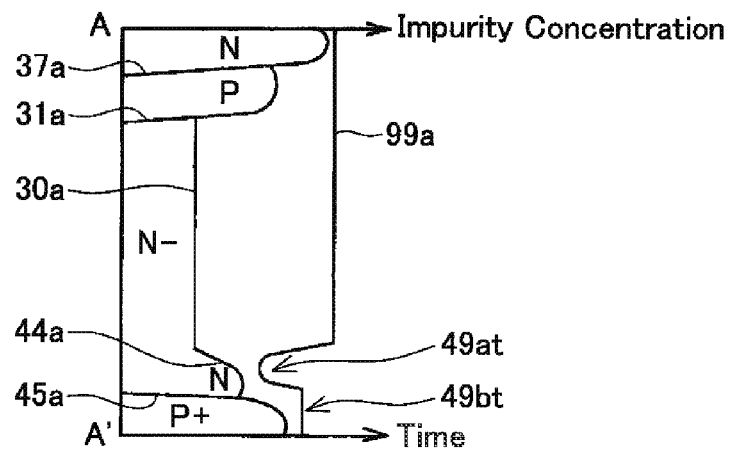
FIGS. 7a, 7b, and 7c are diagrams showing impurity profiles and lifetimes of the respective part shown in FIG. 6.
Figure 7B:
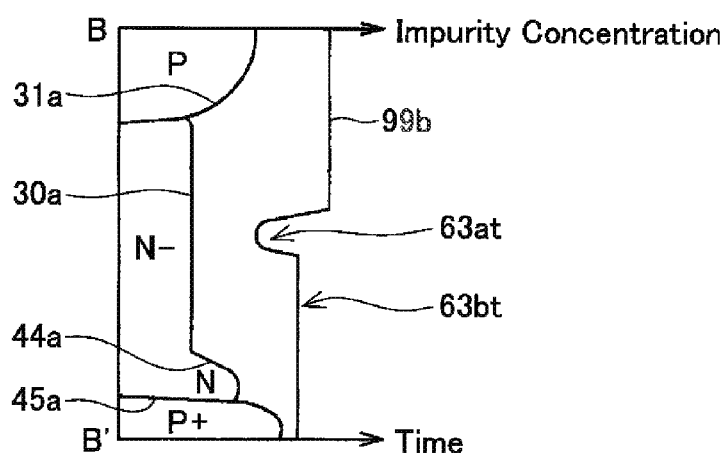
Figure 7C:
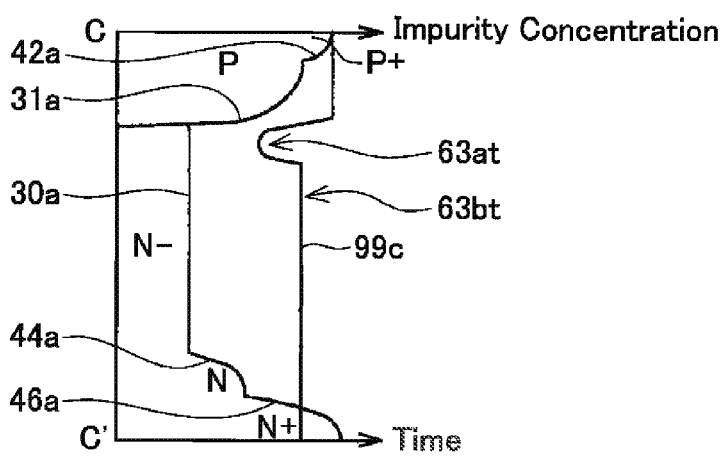

FIG. 7 is a diagram showing lifetimes of respective portions. FIGS. 7a and 7c have a same lifetime distribution as FIGS. 5a and 5c. On the other hand, as shown in FIG. 7b, at the incomplete sub-area 10a, lifetime is shortest in a vicinity of a center of a drift layer 30, and lifetime is also shortened on a side of the rear surface 47 of the center of a drift layer 30.

As described above, by varying the thickness of the He ion mask 52, the penetrating distance of a lifetime shortening region formed on the semiconductor substrate 32 can be controlled.

Fourth Embodiment

Figure 8:
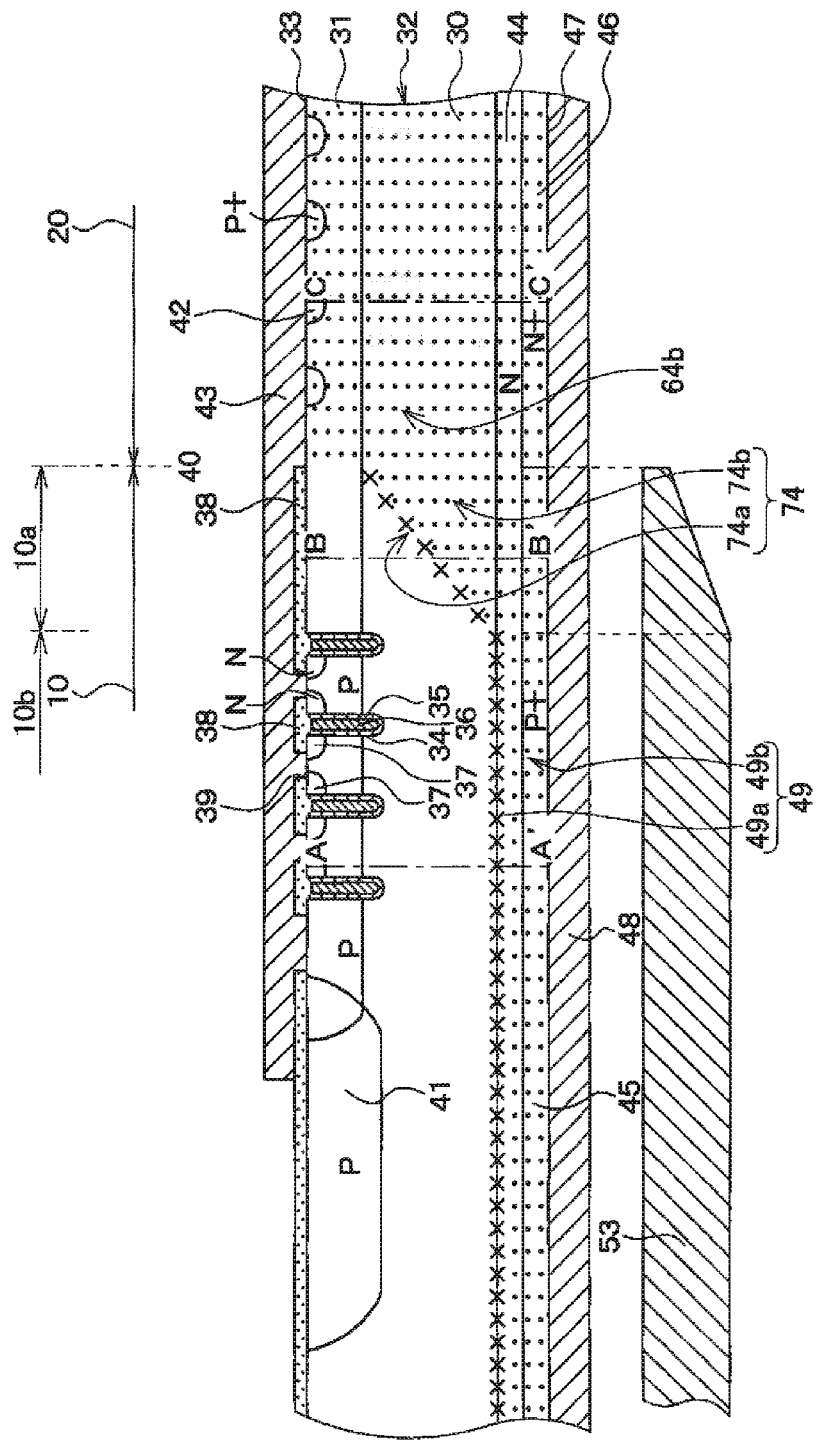
FIG. 8 is a cross-sectional view of a semiconductor device according to a fourth embodiment.

In the present embodiment, portions that differ from the third embodiment will be described. FIG. 8 is a cross-sectional view of a semiconductor device according to the present embodiment which also shows a He ion mask 53 for forming lifetime shortening regions 49, 64b, and 74.

As shown in FIG. 8, in order to prevent He ions for exposing a diode area 20 from being blocked by the He ion mask 53, a tip of the He ion mask 53 that penetrates into the diode area 20 has been cut off. A thickness of the He ion mask 53 varies in a discontinuous manner at a boundary between an incomplete sub-area 10a and the diode area 20. Accordingly, a lifetime shortening region 64b that penetrates deeply from a rear surface 47 is formed at the diode area 20. In this case, at the diode area 20, the He ions penetrate a semiconductor substrate 32 and are not retained in the semiconductor substrate 32.

Figure 9A:
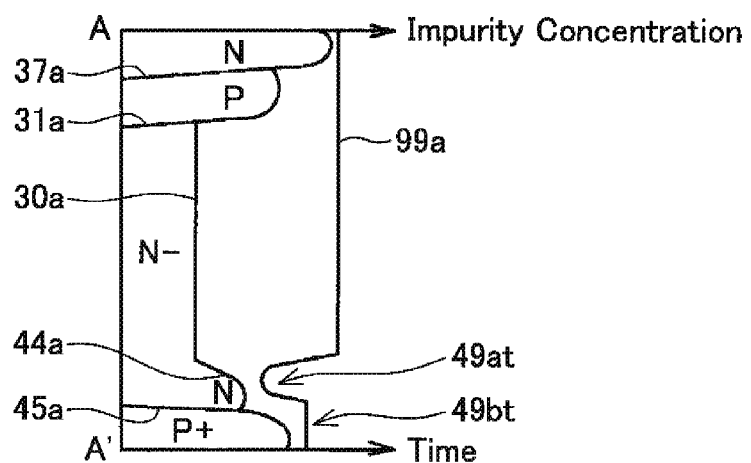
FIGS. 9a, 9b, and 9c are diagrams showing impurity profiles and lifetimes of the respective part shown in FIG. 8.
Figure 9B:
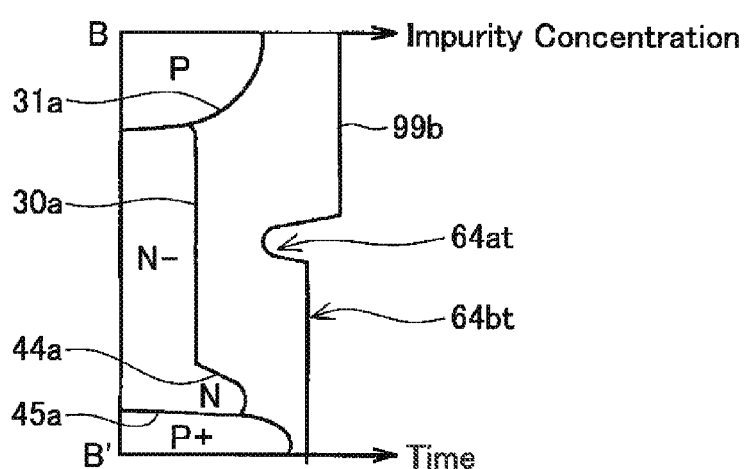
Figure 9C:
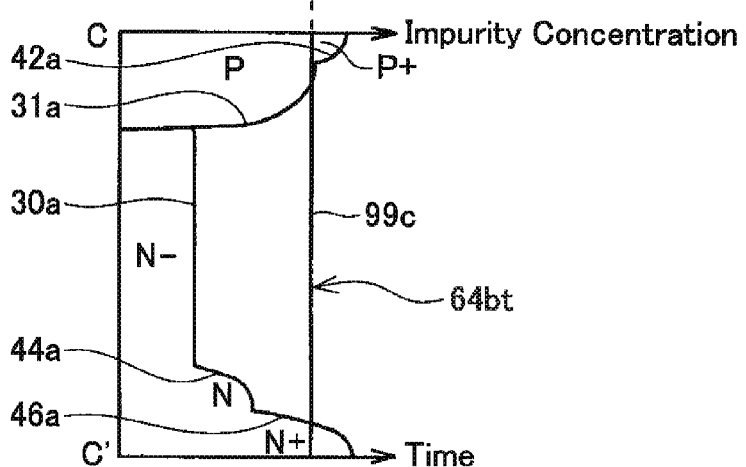

FIGS. 9a and 9b are equivalent to FIGS. 7a and 7b. Meanwhile, as shown in FIG. 9c, at the diode area 20, lifetime is shortened over all of a cathode layer 46, a field stop layer 44, a drift layer 30, a base layer 31, and a contact region 42.

Fifth Embodiment

Figure 10:
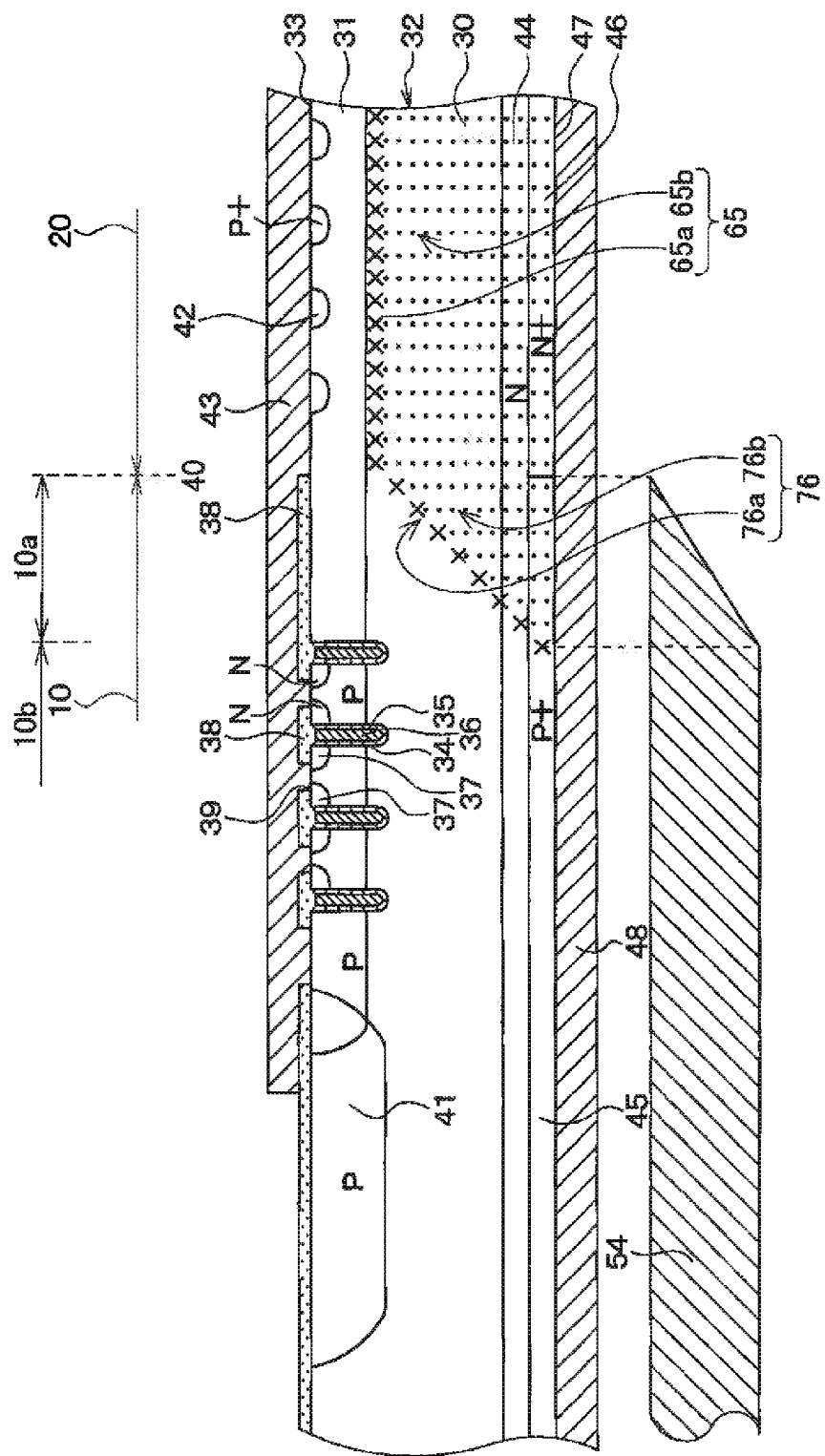
FIG. 10 is a cross-sectional view of a semiconductor device according to a fifth embodiment.

In the present embodiment, portions that differ from the third embodiment will be described. FIG. 10 is a cross-sectional view of a semiconductor device according to the present embodiment which also shows a He ion mask 54 for forming lifetime shortening regions 65 and 76.

As shown in FIG. 10, the He ion mask 54 according to the present embodiment is thick at an area that covers a complete sub-area 10b and does not allow He ions to pass through. Therefore, a lifetime shortening region is not formed in the complete sub-area 10b among an IGBT area 10. The lifetime shortening region 76 is formed only in an incomplete sub-area among the IGBT area 10. A penetrating distance of the lifetime shortening region 76 from a rear surface 47 at the incomplete sub-area 10a is greater the closer to a diode area 20.

At the diode area 20, a deep lifetime shortening region 65 is formed. A penetrating distance of the lifetime shortening region 65 at the diode area 20 is equal to a maximum penetrating distance of a lifetime shortening region 76a at the incomplete sub-area 10a.

Sixth Embodiment

Figure 11:
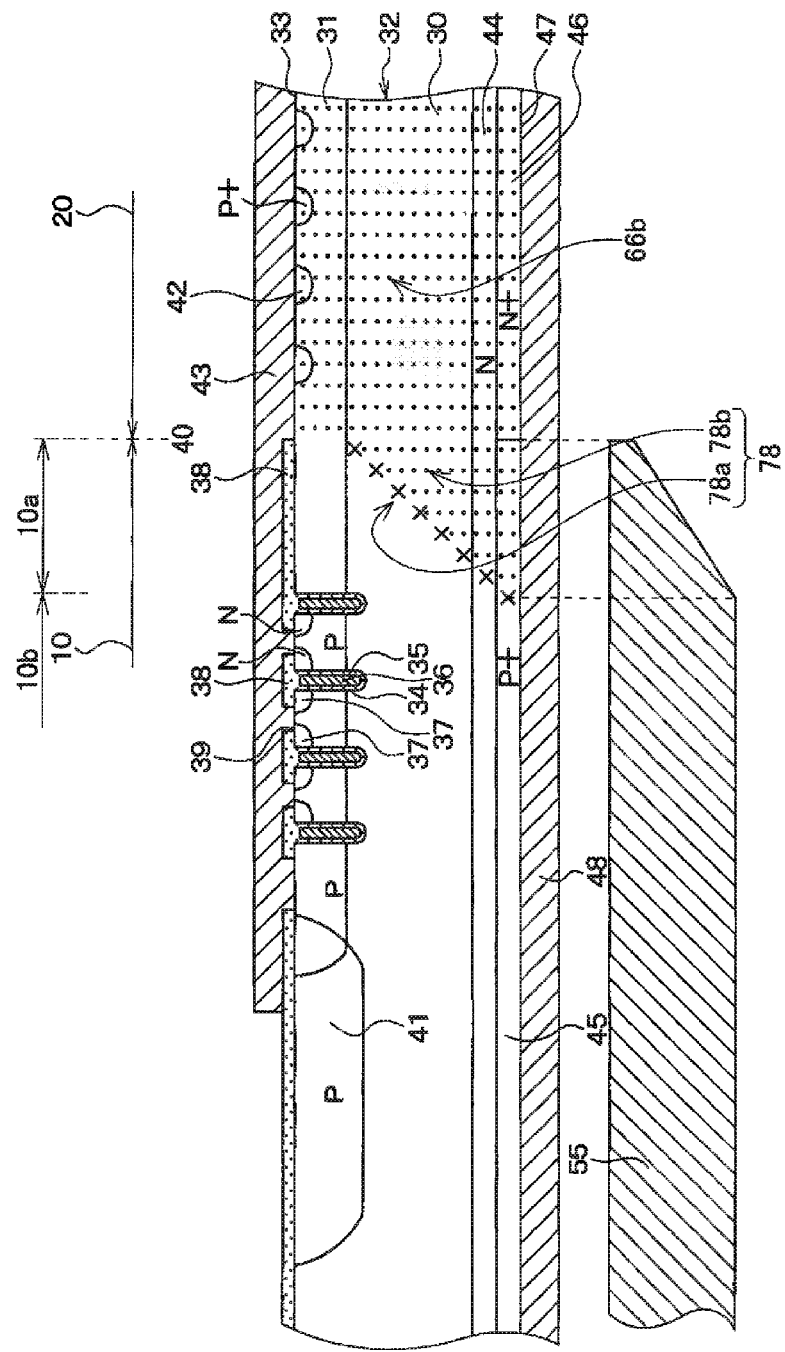
FIG. 11 is a cross-sectional view of a semiconductor device according to a sixth embodiment.

In the present embodiment, portions that differ from the fifth embodiment will be described. FIG. 11 is a cross-sectional view of a semiconductor device according to the present embodiment which also shows a He ion mask 55 for forming lifetime shortening regions 66b and 78.

As shown in FIG. 11, in a complete sub-area 10b, the He ion mask 55 is thick enough to prevent He ions from passing through and is cut so as not to cover a diode area 20. In an incomplete sub-area 10a, the He ion mask 55 becomes thinner towards a diode area 20. A thickness of the He ion mask 55 varies in a discontinuous manner at a boundary 40 between the incomplete sub-area 10a and the diode area 20.

In the embodiment shown in FIG. 11, a lifetime shortening region is not formed at the complete sub-area 10b. The lifetime shortening region 78 is formed at the incomplete sub-area 10a. A penetration depth of the lifetime shortening region 78 as measured from a rear surface 47 of a semiconductor substrate 32 varies in accordance with a variation in the thickness of the He ion mask 55. The closer to the diode area 20, the deeper the penetration. At the diode area 20, He ions penetrate the semiconductor substrate 32. At the diode area 20, a lifetime shortening region 66b is formed over an entire thickness of the semiconductor substrate 32.

As described above, a lifetime shortening region may not be formed at the complete sub-area 10b among the IGBT area 10, and the lifetime shortening region 66b may be formed over the entire thickness of the diode area 20. At the incomplete sub-area 10a, a lifetime shortening region 78 that gradually becomes thicker toward the diode area 20 can be created.

Seventh Embodiment

Figure 12:
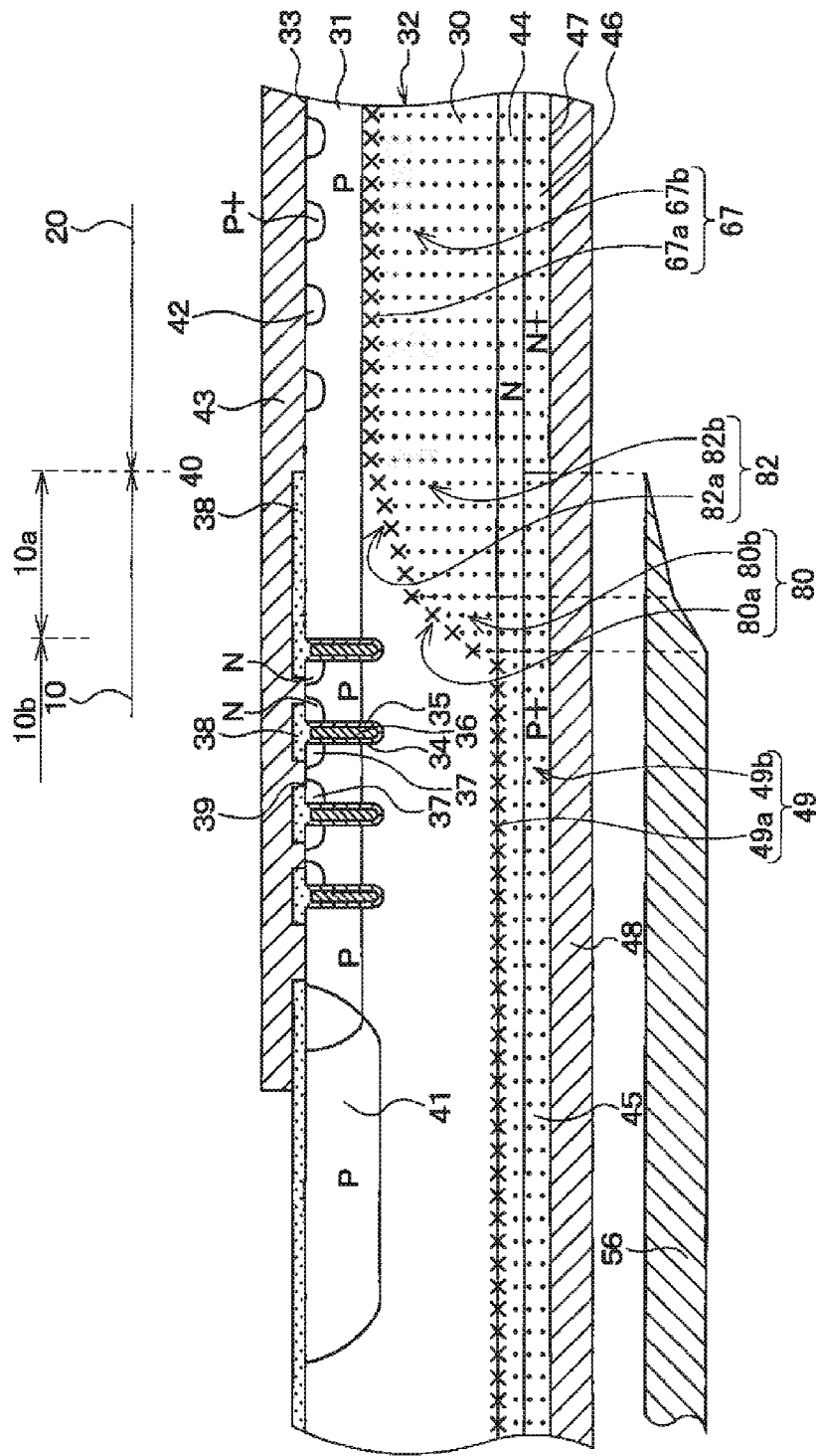
FIG. 12 is a cross-sectional view of a semiconductor device according to a seventh embodiment.

In the present embodiment, portions that differ from the third embodiment will be described. FIG. 12 is a cross-sectional view of a semiconductor device according to the present embodiment which also shows a He ion mask 56 for forming lifetime shortening regions 49, 67, 80, and 82.

As shown in FIG. 12, a rear surface of the He ion mask 56 is inclined at an incomplete sub-area 10a. An angle of inclination thereof is not constant and is divided into a steep area and a moderate area. In other words, a thickness of the mask 56 varies abruptly on a side of a complete sub-area 10b but varies moderately on a side of a diode area 20.

When a semiconductor substrate 32 is exposed to He ions using the He ion mask 56, the thickness of the lifetime shortening regions 80 and 82 formed at the incomplete sub-area 10a vary. In other words, a penetrating distance from a rear surface 47 varies abruptly at the lifetime shortening region 80 on the side near the complete sub-area 10*b* while a penetrating distance from the rear surface 47 varies moderately at the lifetime shortening region 82 on the side near the diode area 20.

When the penetrating distance of the lifetime shortening region 80 on the side near the complete sub-area 10*b* varies abruptly, both a reduction of an on-voltage of an IGBT and suppression of movement of holes from an IGBT area 10 to the diode area 20 can be achieved effortlessly. The incomplete sub-area 10*a* contains both a region that operates as an IGBT element and a region that operates as a diode element. Therefore, lifetime shortening regions 80 and 82 which correspond to the respective operation regions can be provided.

As described above, a depth of a lifetime shortening region that is formed at the incomplete sub-area 10*a* among the IGBT area 10 may be configured to have a plurality of gradients instead of a single gradient.

Other Embodiments

The structures shown in the respective embodiments described above are merely examples and are not to be interpreted as restrictive. Other structures including characteristics of the present invention may be adopted.

Figure 13:
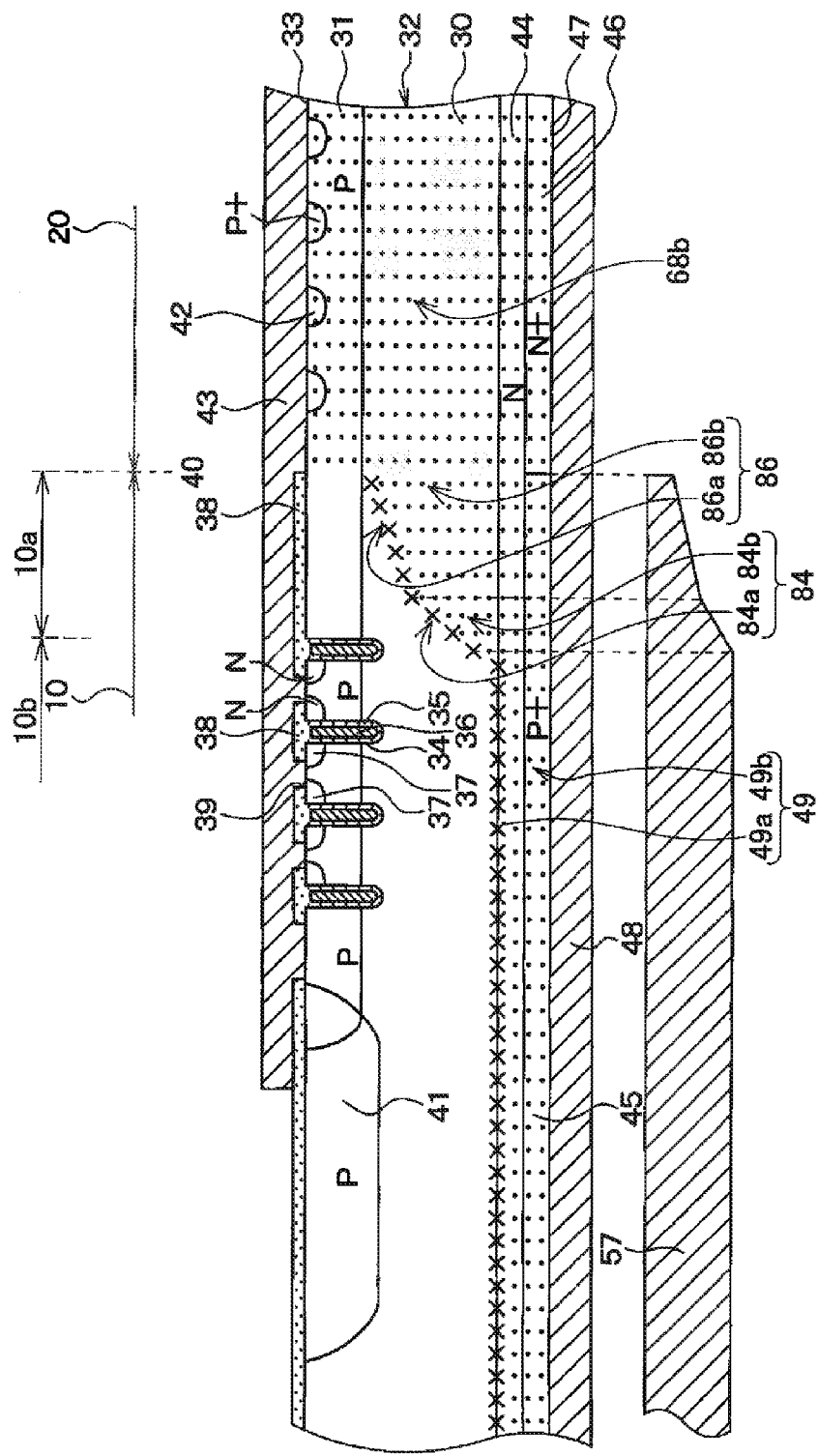
FIG. 13 is a cross-sectional view of a semiconductor device according to another embodiment.

For example, as shown in FIG. 13, by cutting off a tip of a He ion mask 57 which penetrates into a diode area 20, a lifetime shortening region 68 that covers the entire thickness of the diode area 20 can be formed.

Figure 14:
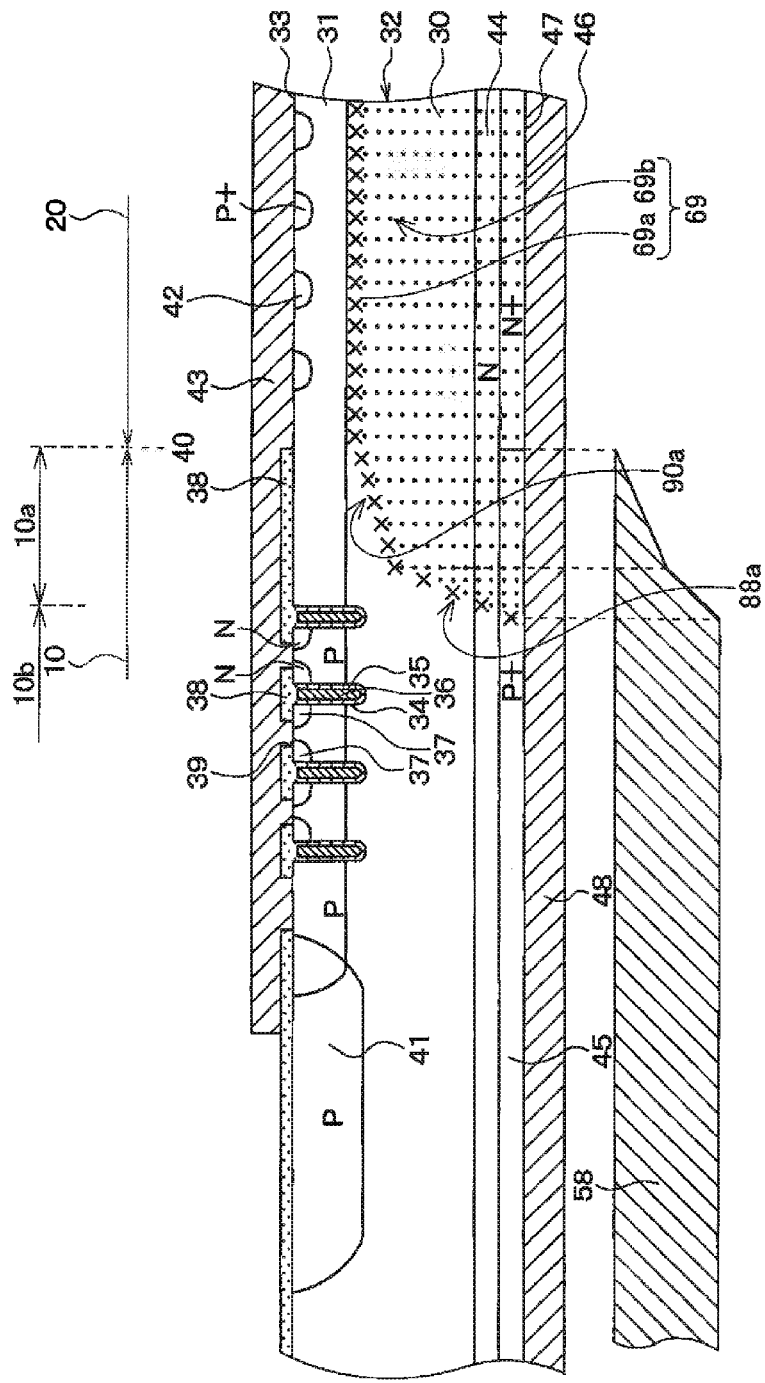
FIG. 14 is a cross-sectional view of a semiconductor device according to yet another embodiment.

In addition, as shown in FIG. 14, by increasing a thickness of a portion that covers a complete sub-area 10*b* among a He ion mask 58, a lifetime shortening region may be prevented from being formed at the complete sub-area 10*b* in regards to the structure shown in FIG. 12.

Figure 15:
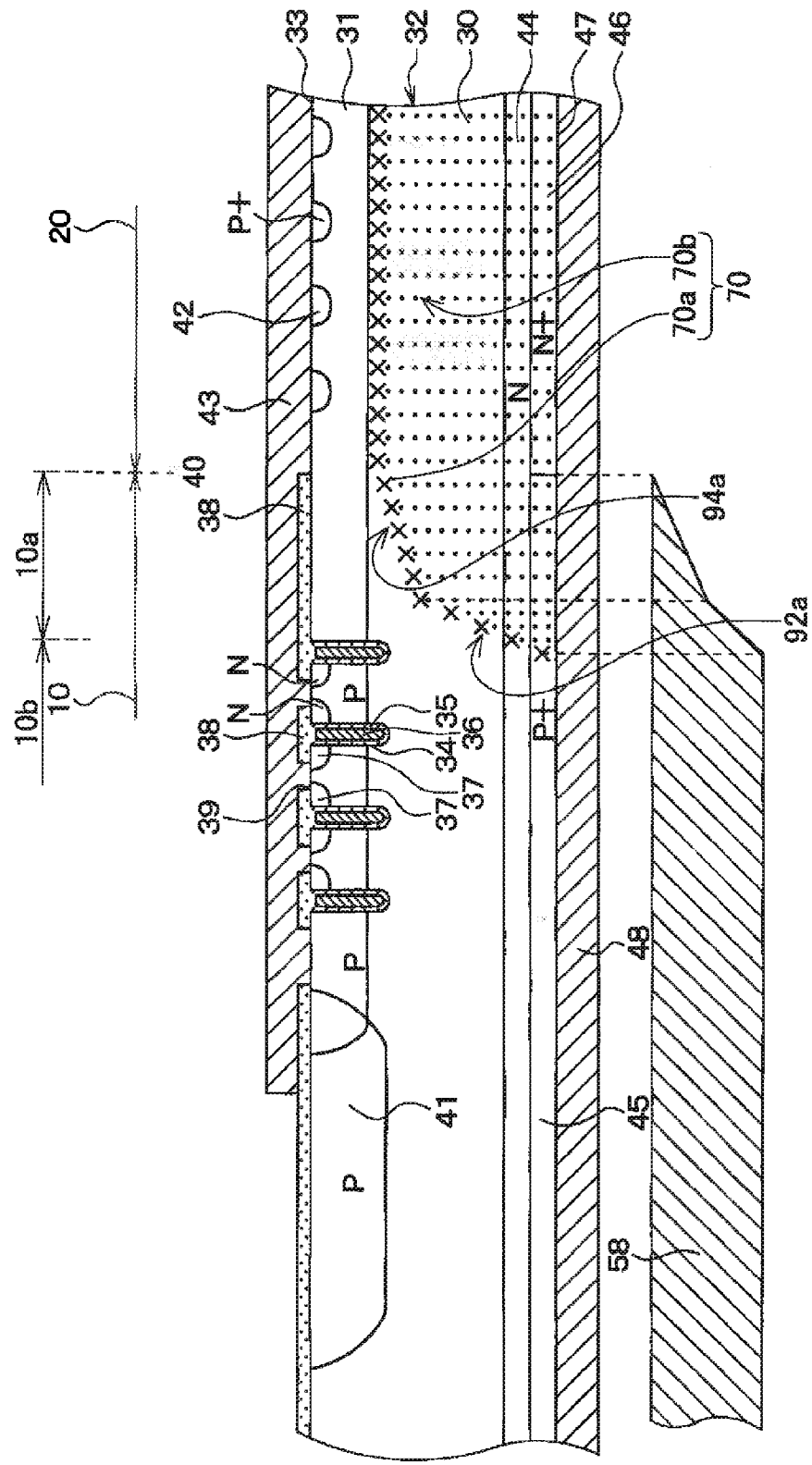
FIG. 15 is a cross-sectional view of a semiconductor device according to still another embodiment.

Furthermore, as shown in FIG. 15, by increasing a thickness of a portion that covers a complete sub-area 10*b*, a lifetime shortening region may be prevented from being formed at the complete sub-area 10*b* in regards to the structure shown in FIG. 13.

What is claimed is:

1. A semiconductor device comprising:
an IGBT structure provided in an IGBT area within a substrate; and
a diode structure provided in a diode area within said substrate,
wherein said IGBT area is adjacent to said diode area,
a region of shortening lifetime of carriers is provided in said IGBT area and said diode area, and
a density of articles of shortening lifetime of carriers in a sub-area that is within said IGBT area and adjacent to said diode area is higher than a density of articles of shortening lifetime of carriers in the other area that is within said IGBT area and separated from said diode area by said sub-area and said density of articles of shortening lifetime of carriers in said sub-area is higher than a density of articles of shortening lifetime of carriers in said diode area.

2. The semiconductor device of claim 1,
wherein said substrate has a first surface and a second surface,
said region of shortening lifetime of carriers has a first part and a second part,
said first part is provided along said first surface in said diode area and said sub-area where emitters of said IGBT structure are not provided,
said second part is provided along said second surface in said IGBT area, and both said first and second parts are provided in said sub-area.

3. The semiconductor device of claim 1,
wherein said region of shortening lifetime of carriers extends from said IGBT area to said diode area,
a collector electrode of said IGBT structure and a cathode electrode of said diode structure are formed on a surface of said substrate, and
a penetrating distance of said region of shortening lifetime of carriers measured from said surface varies such that it has a short distance in said IGBT area except said sub-area, and it has a long distance in said diode area.

4. The semiconductor device of claim 3,
wherein said region of shortening lifetime of carriers extends over whole thickness of said diode area.

5. The semiconductor device of claim 1,
wherein said region of shortening lifetime of carriers extends from said sub-area to said diode area,
a collector electrode of said IGBT structure and a cathode electrode of said diode structure are formed on a surface of said substrate, and
a penetrating distance of said region of shortening lifetime of carriers measured from said surface varies such that it has a long distance in said diode area, and it increases up to said long distance in said sub-area.

6. The semiconductor device of claim 5,
wherein said region of shortening lifetime of carriers extends over whole thickness of said diode area.

7. A semiconductor device comprising:
an IGTBT structure provided in an IGBT area within a substrate; and
a diode structure provided in a diode area within said substrate,
wherein said IGBT area is adjacent to said diode area,
a region of shortening lifetime of carriers is provided in said IGBT area,
a density of articles of shortening lifetime of carriers in a sub-area that is within said IGBT area and adjacent to said diode area is higher than a density of articles of shortening lifetime of carriers in the other area that is within said IGBT area and separated from said diode area by said sub-area,
a collector electrode of said IGBT structure and a cathode electrode of said diode structure are formed on a surface of said substrate,
a penetrating distance of said region of shortening lifetime of carriers measured from said surface changes within said sub-area such that it has a short distance at a side adjacent to an area where emitters of said IGBT structure are provided and it has a long distance at a side adjacent to said diode area, and
a penetrating distance change rate at said side adjacent to said area where emitters of said IGBT structure are provided is steep and a penetrating distance change rate at said side adjacent to said diode area is gentle.

8. A semiconductor device comprising a substrate;
said substrate comprising an IGBT area and an diode area;
said IGBT area comprising a complete sub-area and an incomplete sub-area,
wherein,
said IGBT area is adjacent to said diode area,
said complete sub-area, said incomplete sub-area and said diode area are arranged in sequence,
a complete IGBT structure comprising an emitter, a gate electrode and a collector is provided in said complete sub-area, an incomplete IGBT structure comprising said collector but lacking at least one of said emitter and said gate electrode is provided in said incomplete sub-area, a diode structure is provided in said diode area, a density of lattice defects introduced into said incomplete sub-area is higher than a density of lattice defects introduced into said complete sub-area, and said density of lattice defects introduced into said incomplete area is higher than a density of lattice defects introduced into said diode area.

9. A semiconductor device comprising a substrate;

said substrate comprising an IGBT area and an diode area;

said IGBT area comprising a complete sub-area and an incomplete sub-area, wherein, said IGBT area is adjacent to said diode area, said complete sub-area, said incomplete sub-area and said diode area are arranged in sequence, a complete IGBT structure comprising an emitter, a gate electrode and a collector is provided in said complete sub-area, an incomplete IGBT structure comprising said collector but lacking at least one of said emitter and said gate electrode is provided in said incomplete sub-area, a diode structure is provided in said diode area, a density of recombination centers of carriers introduced into said incomplete sub-area is higher than a density of recombination centers of carriers introduced into said complete sub-area, and said density of recombination centers of carriers introduced into said incomplete area is higher than a density of recombination centers of carriers introduced into said diode area.

* * * * *